(12) United States Patent
Tuen et al.

(10) Patent No.: US 9,313,879 B2
(45) Date of Patent: Apr. 12, 2016

(54) MOTHERBOARD WITH ELECTROSTATIC DISCHARGE PROTECTION FUNCTION

(71) Applicant: Wistron Corp., New Taipei (TW)

(72) Inventors: Lung-Fai Tuen, New Taipei (TW); Wen-Hsien Wang, New Taipei (TW); Chiu-Hsien Chang, New Taipei (TW)

(73) Assignee: WISTRON CORP., New Taipei (TW)

( * ) Notice: Subject to any disclaimer, the term of this patent is extended or adjusted under 35 U.S.C. 154(b) by 55 days.

(21) Appl. No.: 14/056,611

(22) Filed: Oct. 17, 2013

(65) Prior Publication Data

US 2014/0240876 A1   Aug. 28, 2014

(30) Foreign Application Priority Data

Feb. 26, 2013   (TW) .............................. 102106644 A

(51) Int. Cl.
*H02H 9/04* (2006.01)
*H05K 1/02* (2006.01)

(52) U.S. Cl.
CPC ............. *H05K 1/0259* (2013.01); *H02H 9/045* (2013.01); *H05K 2201/09354* (2013.01); *H05K 2201/09363* (2013.01)

(58) Field of Classification Search
CPC ..... H02H 9/045; H02H 9/046; H05K 1/0259; H05K 2201/09354; H05K 2201/09363
See application file for complete search history.

(56) References Cited

U.S. PATENT DOCUMENTS

| 4,164,778 | A | * | 8/1979 | Sawairi | H05K 1/111 361/774 |
| 4,342,013 | A | * | 7/1982 | Kallman | H02H 9/005 177/185 |
| 4,577,258 | A | * | 3/1986 | Jodoin | 361/321.3 |
| 4,854,040 | A | * | 8/1989 | Turek | 29/847 |
| 5,068,631 | A | * | 11/1991 | Vince | 333/181 |
| 5,379,181 | A | * | 1/1995 | Ishii | 361/511 |
| 5,493,259 | A | * | 2/1996 | Blalock et al. | 333/182 |
| 6,294,742 | B1 | * | 9/2001 | Ziemkowski | 174/261 |
| 6,836,397 | B2 | | 12/2004 | Chen et al. | |
| 7,567,419 | B2 | * | 7/2009 | Lu et al. | 361/220 |
| 8,232,827 | B2 | * | 7/2012 | Sagae | H03K 17/102 327/308 |
| 2005/0079828 | A1 | * | 4/2005 | Tasaka | 455/78 |
| 2007/0216015 | A1 | | 9/2007 | Schnitt et al. | |

(Continued)

FOREIGN PATENT DOCUMENTS

| CN | 1607738 A | 4/2005 |
| CN | 1957472 A | 5/2007 |

(Continued)

OTHER PUBLICATIONS

TW Office Action dated Aug. 25, 2014.

(Continued)

*Primary Examiner* — Zeev V Kitov
(74) *Attorney, Agent, or Firm* — McClure, Qualey & Rodack, LLP

(57) ABSTRACT

A motherboard with an electrostatic discharge protection (ESD) function including a first electrode, a second electrode, an isolation region and an energy storage unit is disclosed. The first electrode receives a grounding level. The second electrode includes at least one solder pad to fix an input/output port thereon. The isolation region is disposed between the first and the second electrodes. The energy storage unit is coupled between the first and the second electrodes and disposed across the isolation region.

11 Claims, 5 Drawing Sheets

(56) References Cited

U.S. PATENT DOCUMENTS

2010/0315684 A1* 12/2010 Koike .................... 358/1.16
2013/0194037 A1*  8/2013 Takahashi ................. 330/3
2014/0012143 A1*  1/2014 Gilbert et al. ............ 600/483

FOREIGN PATENT DOCUMENTS

CN          202549831 U    11/2012
TW          200421944 A    10/2004

OTHER PUBLICATIONS

Partial translation of TW Office Action dated Aug. 25, 2014.
CN Office Action dated Nov. 26, 2015 in corresponding Chinese application (No. 201310076312.6).
English translation of CN Office Action dated Nov. 26, 2015 in corresponding Chinese application (No. 201310076312.6).

* cited by examiner

MOTHERBOARD WITH ELECTROSTATIC DISCHARGE PROTECTION FUNCTION

CROSS REFERENCE TO RELATED APPLICATIONS

This Application claims priority of Taiwan Patent Application No. 102106644, filed on Feb. 26, 2013, the entirety of which is incorporated by reference herein.

BACKGROUND OF THE INVENTION

1. Field of the Invention

The invention relates to a motherboard, and more particularly, to a motherboard with an electrostatic discharge (ESD) protection function.

2. Description of the Related Art

As the semiconductor manufacturing process develops, ESD protection has become one of the most critical reliability issues for integrated circuits (IC). In particular, as the semiconductor process advances to the deep sub-micron stage, scaled-down devices and thinner gate oxides are more vulnerable to ESD stress.

BRIEF SUMMARY OF THE INVENTION

An exemplary embodiment of a motherboard with an electrostatic discharge protection (ESD) function comprises a first electrode, a second electrode, an isolation region and an energy storage unit. The first electrode receives a grounding level. The second electrode comprises at least one solder pad to fix an input/output port thereon. The isolation region is disposed between the first and the second electrodes. The energy storage unit is coupled between the first and the second electrodes and disposed across the isolation region.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
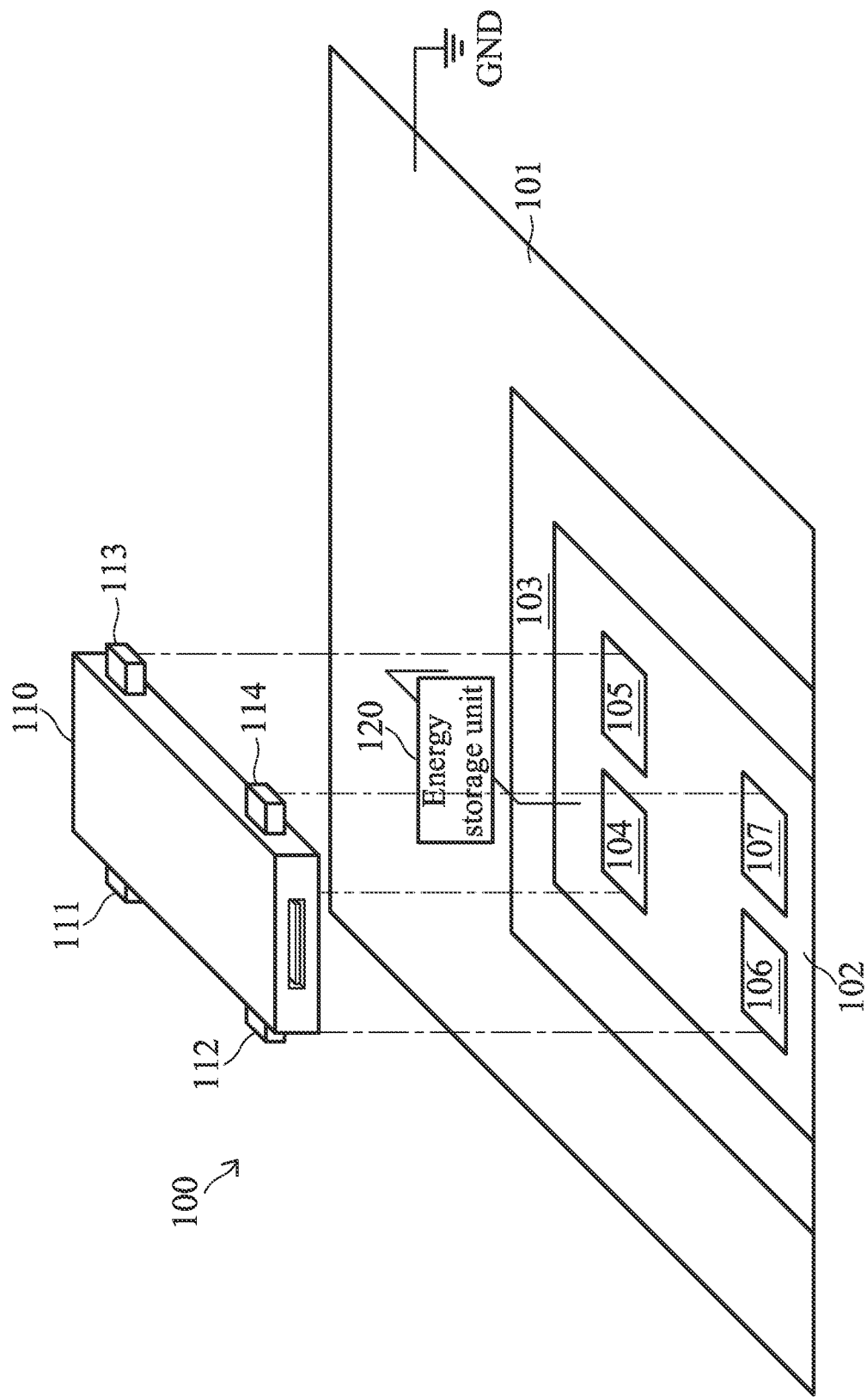
FIG. 1 is a schematic diagram of an exemplary embodiment of a motherboard.

FIG. 1 is a schematic diagram of an exemplary embodiment of a motherboard. The motherboard 100 is capable of preventing interference caused by an ESD event. The motherboard 100 comprises electrodes 101, 102, an isolation region 103 and an energy storage unit 120, but the disclosure is not limited thereto. In order to clearly show elements and structures with an ESD function, FIG. 1 only shows some elements and structures. In other embodiments, the motherboard 100 comprises other elements, such as micro-processors, controllers and memories.

The electrode 101 receives a grounding level GND. The electrode 102 comprises at least one solder pad to fix an input/output port 110 thereon. The invention does not limit the number of the solder pads of the electrode 102. In one embodiment, the number of the solder pads of the electrode 102 relates to the number of fixed pads of the input/output port 110. As shown in FIG. 1, the input/output port 110 comprises fixed pads 111~114. Thus, the electrode 102 comprises solder pads 104~107.

In this embodiment, the fixed pads 111~114 do not have a transmission function such that the fixed pads 111~114 cannot transmit signal. The input/output port 110 achieves communication between other elements (not shown) on the motherboard 100 and a peripheral device (not shown) via other pins.

The invention does not limit how the input/output port 110 is fixed on the motherboard 100. In one embodiment, the input/output port 110 is a surface mount device (SMD). When the fixed pads 111~114 are soldered with the solder pads 104~107, the input/output port 110 is fixed on the motherboard 100. In other embodiments, the dual in-line package (DIP) technology is utilized to fix the input/output port 110 on the motherboard 100.

The isolation region 103 is disposed between the electrodes 101 and 102 to completely or not completely separate the electrodes 101 and 102. In this embodiment, the electrodes 101 and 102 are completely separated by the isolation region 103. Thus, the electrode 101 is not directly and electrically connected to the electrode 102. The invention does not limit the shape and the size of the isolation region 103. Any shape and size can be applied on the motherboard as long as the shape and size are capable of isolating the electrodes 101 and 102.

The invention does not limit the voltage level of the electrode 102. In one embodiment, the electrode 102 receives the grounding level GND. In another embodiment, the voltage level of the electrode 102 is at a floating level or a fixed level.

The energy storage unit 120 is coupled between the electrodes 101 and 102. In one embodiment, the energy storage unit 120 is disposed across the isolation region 103. The invention does not limit the position of the energy storage unit 120. In one embodiment, one terminal of the energy storage unit 120 is electrically connected to the electrode 101 and another terminal of the energy storage unit 120 is electrically connected to the electrode 102. The another terminal of the energy storage unit 120 approaches one of the solder pads 104~107.

Figure 2A:
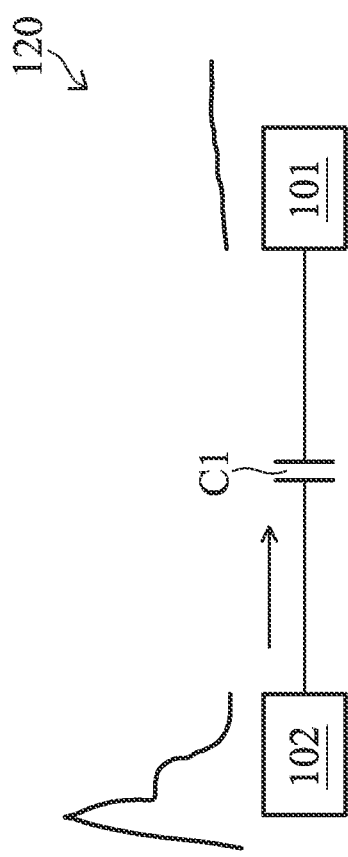
FIGS. 2A, 2B, 3 and 4 are schematic diagrams of other exemplary embodiments of an energy storage unit.

The invention does not limit the structure of the energy storage unit 120. Any structure can be served as the energy storage unit 120, as long as the structure is capable of storing energy. In this embodiment, the energy storage unit 120 is a passive element. FIG. 2A is a schematic diagram of an exemplary embodiment of an energy storage unit. As show in FIG. 2A, the energy storage unit 120 comprises a capacitor C1. In this embodiment, the capacitor C1 is an unpolarised capacitor. In other embodiments, the capacitance of the capacitor C1 is higher than 1 uF.

When a tester tests the input/output port 110 on the motherboard 100, the testers use an electronic gun for ESD stress applied to an exposed metal of the input/output port 110. Since the exposed metal of the input/output port 110 is electrically connected to the fixed pads 111~114, an ESD current enters the electrode 102. However, the capacitor C1 has an energy storing function and a buffer function. Thus, the capacitor C1 attracts the ESD current from the electrode 102.

The capacitor C1 stores the ESD current such that the ESD current does not enter the electrode 101 and the elements connecting to the electrode 101 are protected. As shown in FIG. 2A, the voltage level of the electrode 101 does not violently change.

Figure 2B:
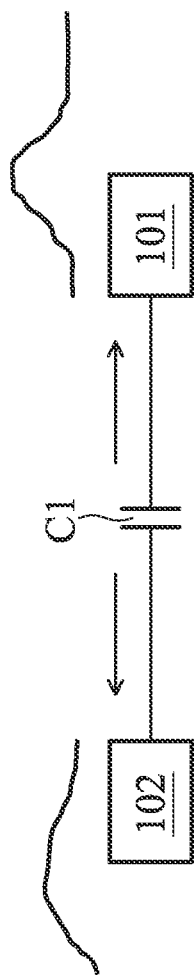

Refer to FIG. 2B, after a fixed time, since each of the voltage levels of the electrodes 101 and 102 is less than the voltage level crossing the capacitor C1, the charge of the capacitor C1 is discharged and the discharged charge is released to the electrodes 101 and 102. After a unit of time, the ESD current stored in the capacitor C1 is released.

Figure 3:
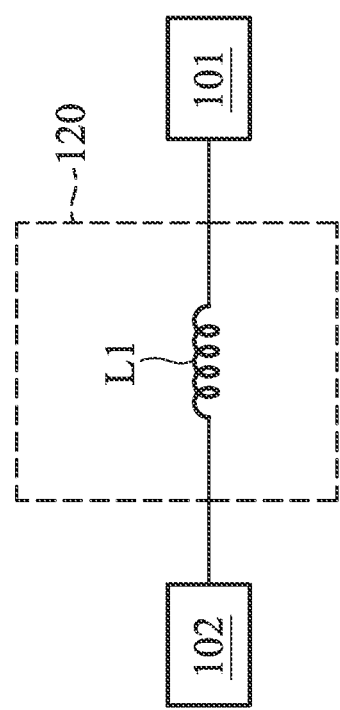
Figure 4:
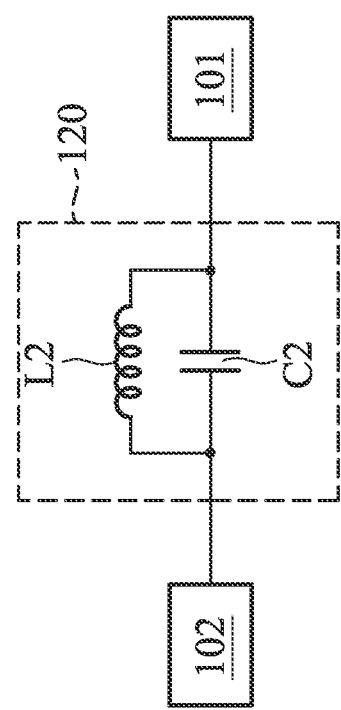

FIGS. 3 and 4 are schematic diagrams of other exemplary embodiments of the energy storage unit. Refer to FIG. 3, the energy storage unit 120 comprises an inductor L1. Refer to FIG. 4, the energy storage unit 120 comprises a capacitor C2 and an inductor L2. The capacitor C2 is connected to the inductor L2 in parallel.

Figure 5:
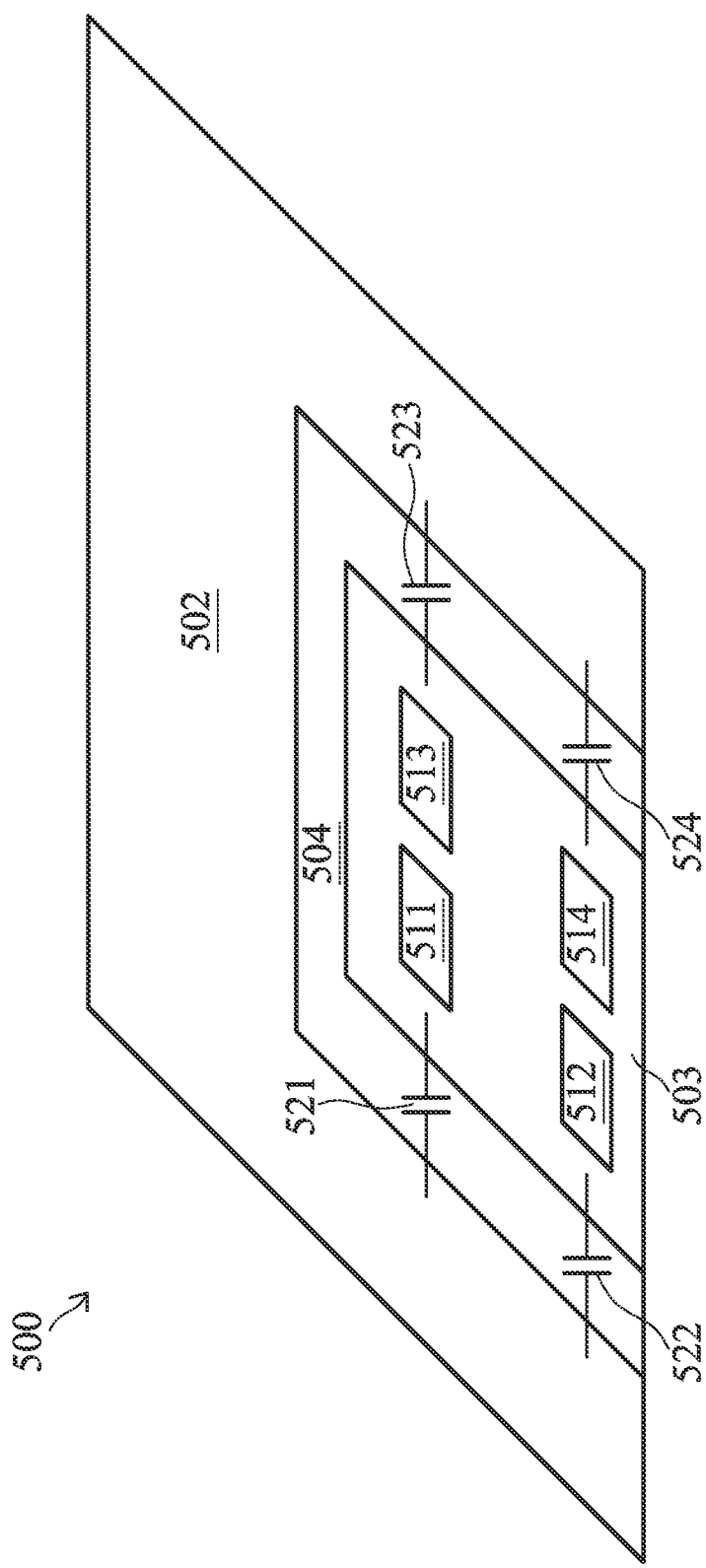
FIGS. 5 and 6 are schematic diagrams of other exemplary embodiments of a motherboard.

The invention does not limit the structure of the energy storage unit 120. Taking a capacitor as an example, the energy storage unit 120 may comprise a plurality of capacitors. The number of the capacitors of the energy storage unit 120 is the same as the number of the fixed pads of the input/output port 110. FIG. 5 is a schematic diagram of another exemplary embodiment of a motherboard. As shown in FIG. 5, the motherboard 500 comprises electrodes 502, 503, an isolation region 504 and an energy storage unit.

The isolation region 504 is disposed between the electrodes 502 and 503 to isolate the electrodes 502 and 503. The electrode 503 comprises solder pads 511~514 to connect to the fixed pad of an input/output port (not shown). In this embodiment, the energy storage unit comprises the capacitors 521~524. The capacitors 521~524 are coupled between the electrodes 502 and 503 and disposed across the isolation region 504. In one embodiment, each of the capacitors 521~524 approaches to a corresponding solder pad. Taking the capacitor 521 as an example, a distance between the capacitor 521 and the solder pad 511 is less than a distance between the capacitors 522~524 and the solder pad 511. Additionally, the invention does not limit the capacitances of the capacitors 521~524. In one embodiment, one of the capacitances of the capacitors 521~524 is less than, equal to, or higher than another of the capacitances of the capacitors 521~524.

Figure 6:
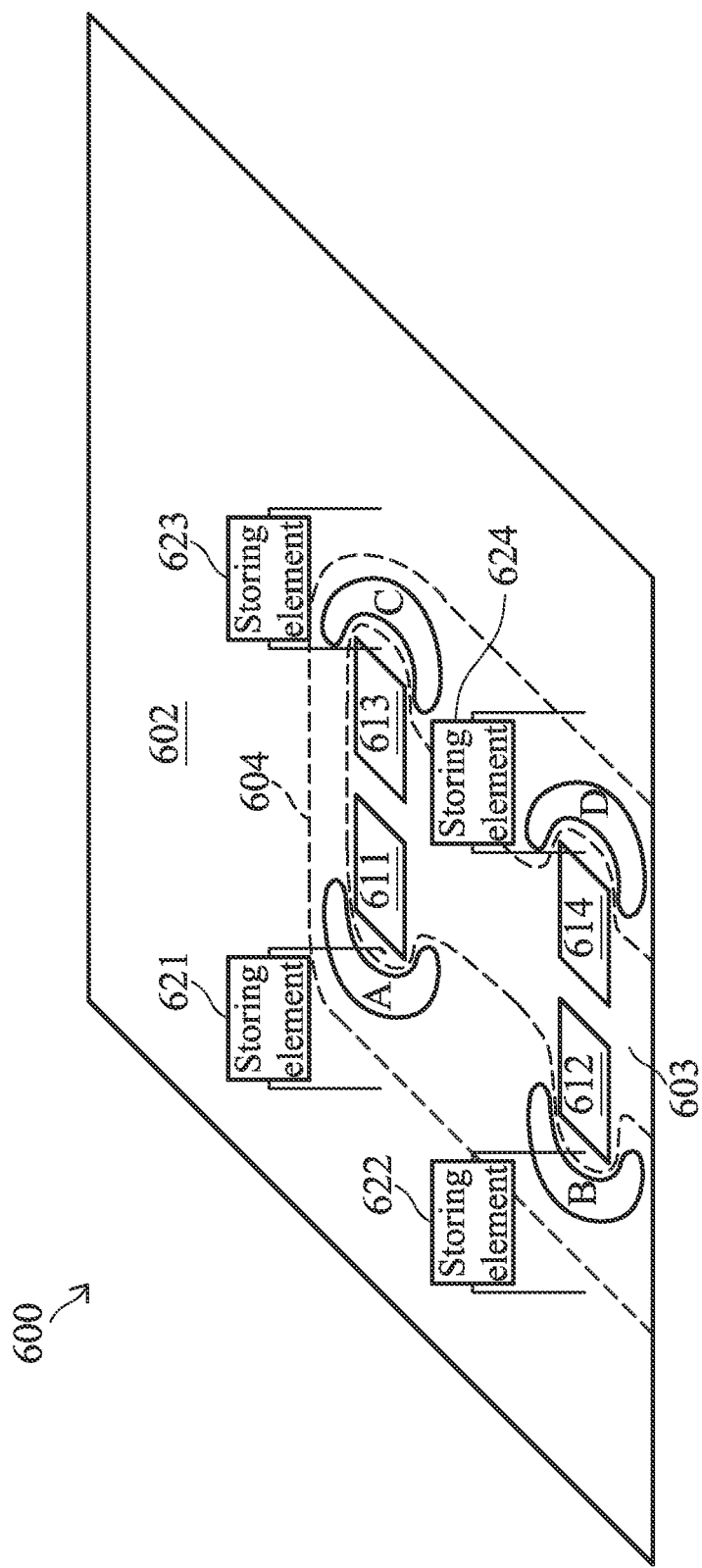

FIG. 6 is a schematic diagram of another exemplary embodiment of the motherboard. The motherboard 600 comprises electrodes 602, 603, an isolation region 604 and an energy storage unit. The electrode 603 comprises the solder pads 611~614. The isolation region 604 is disposed between the electrodes 602 and 603. In this embodiment, the electrodes 602 and 603 are not completely separated by the isolation region 604.

The isolation region 604 comprises the segments A~D. Each segment is disposed between the electrode 602 and a corresponding solder pad. For example, the segment A is disposed between the electrode 602 and the solder pad 611, and the segment D is disposed between the electrode 602 and the solder pad 614. The invention does not limit the number of the segments. In one embodiment, the number of the segments is the same as the number of the fixed pads of the input/output port.

In this embodiment, the energy storage unit comprises the storing elements 621~624. The invention does not limit the number of the storing elements. In one embodiment, the number of the storing elements is the same as the number of the segments. As shown in FIG. 6, the storing elements 621~624 are coupled between the electrodes 602 and 603 and each storing element is disposed across a corresponding segment. For example, the storing element 623 is disposed across the segment C.

The invention does not limit the shapes and the sizes of the segments. Any shapes and sizes can be applied on the motherboard 600, as long as the shapes and the sizes are capable of isolating the electrodes 602 and 603. In one embodiment, a corresponding solder pad and the electrode 602 is completely separated by one of the segments A~D. For example, the segment A surrounds the solder pad 611 to completely separate the solder pad 611 and the electrode 602.

In another embodiment, the shapes and the sizes of the segments of the isolation region 604 are not the same. For example, one shape or one size of the segments A~D is different from another shape or another size of the segments A~D.

In this embodiment, the segments A~D are not connected together. In other embodiments, one of the segments A~D may connect to another of the segments A~D.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A motherboard with an electrostatic discharge protection (ESD) function, comprising:
   a first electrode receiving a grounding level;
   a second electrode comprising at least one solder pad to fix an input/output port thereon;
   an isolation region disposed between the first and the second electrodes; and
   an energy storage unit coupled between the first and the second electrodes and disposed across the isolation region,
   wherein the energy storage unit does not electrically connect to the isolation region,
   wherein the second electrode receives the grounding level, and
   wherein the capacitance of the capacitor is higher than 1 uF.

2. The motherboard as claimed in claim 1, wherein the first and the second electrodes are completely separated by the isolation region.

3. The motherboard as claimed in claim 1, wherein the isolation region is divided into a plurality of segments, the input/output port comprises a plurality of fixed pads, and the number of the segments is the same as the number of the fixed pads.

4. The motherboard as claimed in claim 3, wherein the energy storage unit comprises a plurality of storing elements, and the number of the storing elements is the same as the number of the segments.

5. The motherboard as claimed in claim 4, wherein each segment is disposed between a corresponding solder pad and the second electrode.

6. The motherboard as claimed in claim 3, wherein the segments are not connected to each other.

7. The motherboard as claimed in claim 1, wherein the energy storage unit is a passive element.

8. The motherboard as claimed in claim 1, wherein the energy storage unit comprises a capacitor.

9. The motherboard as claimed in claim 8, wherein the capacitor is an unpolarised capacitor.

10. The motherboard as claimed in claim 1, wherein the energy storage unit comprises an inductor.

11. The motherboard as claimed in claim 1, wherein the energy storage unit comprises a capacitor and an inductor, and the capacitor is connected to the inductor in parallel.

* * * * *